United States Patent [19]

Hartmann

[11] Patent Number: 4,624,864

[45] Date of Patent: Nov. 25, 1986

[54] PROCESS FOR THE AUTOPOSITIONING OF AN INTERCONNECTION LINE ON AN ELECTRIC CONTACT HOLE OF AN INTEGRATED CIRCUIT

[75] Inventor: Joël Hartmann, Claix, France

[73] Assignee: Commissariat a l'Energie Atomique, Paris, France

[21] Appl. No.: 744,395

[22] Filed: Jun. 13, 1985

[30] Foreign Application Priority Data

Jun. 14, 1984 [FR] France .................. 84 09313

[51] Int. Cl.$^4$ .................. H01L 21/283; H01L 21/90
[52] U.S. Cl. .................. 427/89; 156/643; 427/90; 427/96; 430/316
[58] Field of Search .................. 427/89, 90, 96; 430/316; 156/643

[56] References Cited

U.S. PATENT DOCUMENTS

| | | | |
|---|---|---|---|
| 4,025,411 | 5/1977 | Hom-Ma | 156/643 |
| 4,361,599 | 11/1982 | Wourms | 427/90 |
| 4,392,298 | 1/1983 | Barker et al. | 29/591 |
| 4,518,629 | 5/1985 | Jeuch | 427/89 |
| 4,520,041 | 5/1985 | Aoyama | 427/90 |
| 4,538,344 | 9/1985 | Okumura | 427/90 |
| 4,544,576 | 10/1985 | Chu | 427/96 |

FOREIGN PATENT DOCUMENTS 0002798 7/1979 European Pat. Off.
0070737 1/1983 European Pat. Off.

Primary Examiner—John D. Smith
Attorney, Agent, or Firm—Oblon, Fisher, Spivak, McClelland & Maier

[57] ABSTRACT

This process consists of depositing a first conductive coating on the complete circuit, depositing on said coating a filling material used for filling the contact hole, the surface of said material being substantially planar, carrying out an anisotropic etching of said filling material so as to expose those parts of the first conductive coating located outside the contact hole and only retaining that part of said filling material which fills the contact hole, depositing on the structure obtained a second conductive coating in which the interconnection line will be formed, producing in the second conductive coating a resin mask used for defining the dimensions of the line, eliminating those parts of the second and first conductive coatings which are free from the mask and eliminating the mask.

8 Claims, 10 Drawing Figures

PROCESS FOR THE AUTOPOSITIONING OF AN INTERCONNECTION LINE ON AN ELECTRIC CONTACT HOLE OF AN INTEGRATED CIRCUIT

BACKGROUND OF THE INVENTION

The present invention relates to a process for the autopositioning of an interconnection line on an electric contact hole of an integrated circuit. This autopositioning process can more particularly be used in processes for the production of MOS (metal-oxide-semiconductor) integrated circuits.

FIGS. 1 and 2 show in section and according to the prior art, the stages of a process for the autopositioning of an interconnection line on an electric contact hole of an integrated circuit. The integrated circuit 2 comprises a doped semiconducting active zone 4, corresponding e.g. to the source or drain of an MOS transistor, which is to be electrically connected to another, not shown, active zone of the integrated circuit. This active zone 4 is covered with an oxide coating 6, in which is produced the electric contact hole 7 of said active zone 4, by chemically etching oxide coating 6 to an appropriate mask placed on said coating. The interconnection of active zone 4 and the other active zone of the integrated circuit is brought about by covering a complete integrated circuit with a generally aluminum conductive coating 8, followed by the etching of said coating. As coating 8 has a constant thickness, it forms a cavity above the electric contact hole 7.

In order to produce the interconnection line 8a (visible in FIG. 2) in conductive coating 8, on the latter is deposited a resin layer 10, which is then etched so as to only remain in the cavity positioned above the electric contact hole 7. In a resin layer 12 is then formed a mask representing the image of the interconnection line. The conductive coating 8 is then etched trough the mask, e.g. isotropically by chemical etching, or anisotropically by a plasma containing compounds such as $CCl_4$. The resin layers 10 and 12 are then eliminated. This leads to the interconnection line 8a shown in section in FIG. 2.

This process, described in French Patent Application No. 82 06409 of April 14, 1982 filed in the name of the present applicant, makes it possible to form interconnection lines on an electric contact hole, without said lines projecting beyond said hole. Thus, it makes it possible to produce interconnection lines, whose width does not exceed the diameter of the electric contact hole, which makes it possible to increase the integration density compared with other known processes. However, in this process, the residue of the first resin layer 10 has a limited thickness and only resists with difficulty the etching during the formation of the interconnection line.

Moreover, the active zone and the interconnection line are in direct contact and metal atoms, e.g. of aluminium with the metal coating is made from such a material, during subsequent heat treatment operations, diffuse into the active zone, which leads to leakage currents, which can be harmful to the satisfactory operation of integrated circuits.

SUMMARY OF THE INVENTION

The present invention relates to a process for the autopositioning of an interconnection line on an electric contact hole of an integrated circuit, which more particularly makes it possible to obviate the various disadvantages referred to hereinbefore.

More specifically, the present invention relates to a process for the autopositioning of an interconnection line on an electric contact hole of an integrated circuit, wherein, with the electric contact hole formed, the following successive operations are performed, (a) deposition of a first conductive coating on the complete integrated circuit, (b) deposition of the first conductive coating of a filling material used for filling the contact hole, the surface of said material being substantially planar, (c) carrying out an anisotropic etching of the filling material, so as to expose those parts of the first conductive coating located outisde the contact hole, and whilst retaining only that filling material portion which fills the contact hole, and (d) deposition on the structure obtained of a second conductive coating, in which the interconnection line will be formed, (e) formation on the second conductive coating of a resin mask used for defining the dimensions of the interconnection line, (f) elimination of those parts of the second and first conductive coatings which are free from the mask, in order to form the interconnection line, (g) elimination of the mask.

The function of the first conductive coating is to effectively provide a diffusion barrier (i.e. which opposes diffusion) of the atoms of the interconnection line into the active zone to be connected, thus protecting the active zone and consequently the underlying semiconductor junctions.

Moreover, the use of a material completely filling the electric contact hole makes it possible, even if the resin mask for defining the interconnection line is misaligned with respect to the contact hole to ensure an electric contact throughout said hole.

According to a preferred embodiment of the process according to the invention, the first conductive coating is a metallic film, preferably of an alloy of titanium and tungsten, or of tungsten along. As a result of its relatively low resistivity, the use of such a material makes it possible to obtain a relatively low contact resistance between the interconnection line and the electric contact hole.

According to a preferred embodiment of the process according to the invention, the first conductive coating is deposited by a magnetron sputtering process, and the filling material is deposited by an isotropic deposition process (LPCVD).

Advantageously, the filling material is of polycrystalline silicon.

According to another preferred embodiment of the invention, the filling material has a thickness exceeding half the width of the electric contact hole, which makes it possible to completely fill said hole.

According to another preferred embodiment of the process according to the invention, stage (c) is performed by depositing a resin layer on the filling material and by simultaneously etching the resin layer and the filling material at identical etching speeds, for the resin and the filling material. This makes it possible to make the filling material flush with the surface of the contact hole.

According to a preferred embodiment of the process according to the invention, stage (f) is performed by dry anistropic etching.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
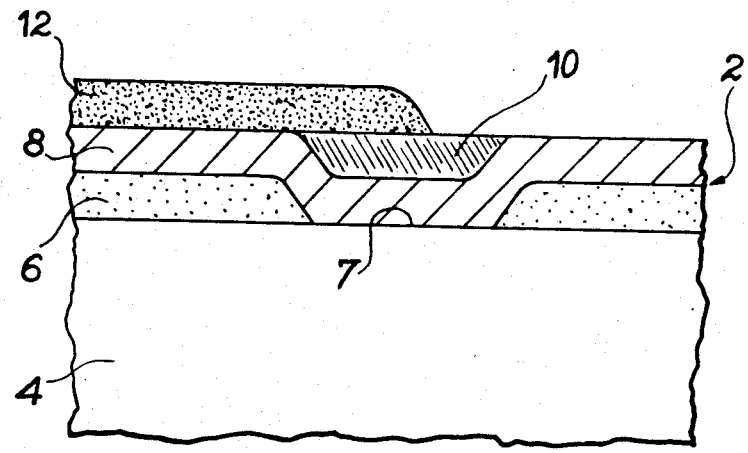
FIGS. 1 and 2 already described, diagrammatically the stages of a process for the autopositioning of an interconnection line on a contact hole of an integrated circuit according to the prior art.
Figure 2:
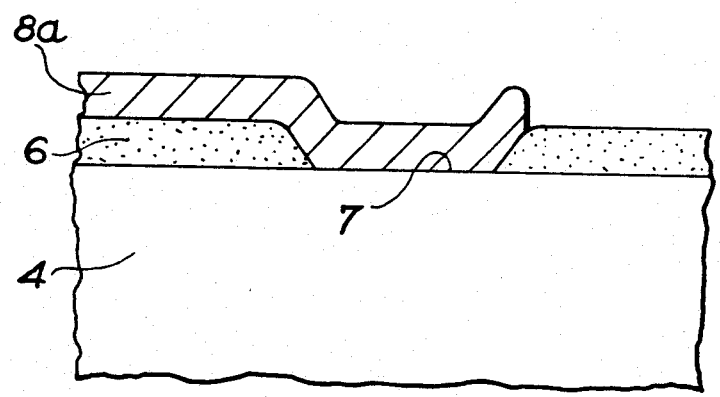
Figure 3:
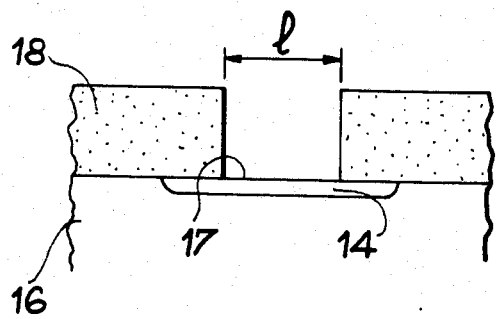
FIGS. 3 to 6, 9 and 10 diagrammatically, the different stages of the process for the autopositioning on an electric contact hole of interconnection line according to the invention.

FIG. 3 shows a part of an integrated circuit having a doped semiconductive active zone 14, formed in a monocrystalline silicon substrate 16 and corresponding e.g. to the source or drain of a MOS transistor, which it is wished to electrically connect to another, not shown active zone of the integrated circuit. Conventionally, said active zone 14 is covered with an insulating coating 18, generally of silicon oxide and which can contain 5 to 10% phosphorus. For example, the oxide coating has a thickness of 0.8 $\mu$m. The later is then etched by using a resin mask produced by photolithography on said coating, e.g. by anistropic etching, such as reactive ionic etching with $CHF_3$, so as to form the electric contact hole 17 of active zone 14. This type of etching makes it possible to obtain a contact hole having edges substantially perpendicular to the surface of the integrated circuit.

Figure 4:
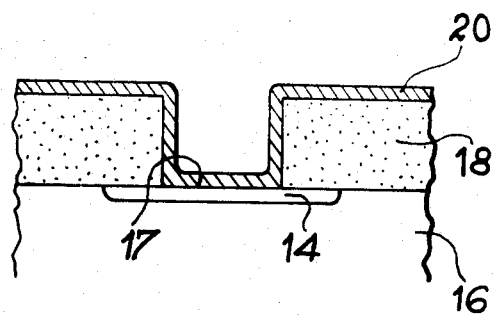

Following the formation of the electric contact hole 17, a first conductive coating 20 is deposited on the complete integrated circuit, as shown in FIG. 4. This first conductive coating 20, which has a thickness of 1000 to 1500 Å, (0.1 to 0.15 $\mu$m) can be deposited by magnetron sputtering of vacuum evaporation.

The first conductive coating makes it possible to ensure a very good electric contact with the active zone 14 of the integrated circuit. Moreover, said coating 20 acts as a diffusion barrier, i.e. a barrier preventing the diffusion of atoms of the material constituting the interconnection line to be formed in the active zone 14.

Advantageously, the conductive coating 20 is made from metal, and in particular an alloy of titanium and tungsten, or tungsten alone, which makes it possible to obtain a relatively low contact resistance between the interconnection line to be formed and the electric contact hole 17, bearing in mind the low resistivity of this material.

Obviously the first conductive coating can be amde from a metal other than tungsten or a tungsten-titanium alloy, its main feature being that of ensuring an effective diffusion barrier between the interconnection line to be formed and the semiconducting junction positioned beneath the electric contact hole.

Figure 5:
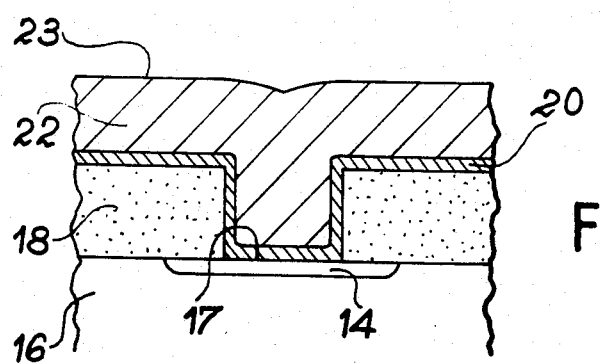

The following stage of the process as shown in FIG. 5, consists of depositing on the first conductive coating 20 a filling material 22, formed e.g. from polycrystalline silicon, which serves to completely fill the electric contact hole 17 and to flatten, level or planarize the topography of the integrated circuit of said contact hole. It therefore has a substantially planar surface 23. This filling material 22 preferably has a thickness exceeding half the width $\frac{1}{2}$ (FIG. 3) of the electric contact hole 17, e.g. for a contact hole of 1 on 1 $\mu$m, said material 22 can have a thickness between 7,000 and 10,000 Å (0.7 and 1 $\mu$m).

The filling of the electric contact hole 17 with material 22, as well as the obtaining of a planar surface 23 of said material can be brought about by means of an isotropic deposition process, which, in the case of a polycrystalline silicon filling material 22, can be carried out by a vapour phase chemical deposition process at atmospheric pressure (CVD) or at low pressure (LPCVD).

Figure 6:
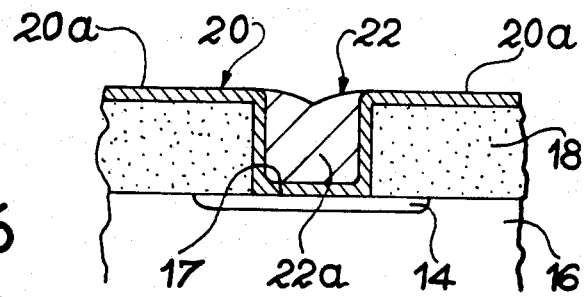

It should be noted that the filling material 22 is not necessarily conductive. It can be insulating, its main feature being that it is isotropically deposited and ensures a good filling of the electric contact hole. As shown in FIG. 6, the following stages of the process consists of anistropically etching the filling material 22. This etching is carried out so as to expose those parts 20a of the first conductive coating located outside the electric contact hole 17, whilst only retaining that part 22a of the filling material which fills the contact hole. This etching must consequently have a selectivity character, so as to only etch material 22 and to stop on exposing the regions 20a of the first conductive coating.

Such an etching can be carried out by means of a so-called "whole section" etching, i.e. without the use of a mask, by e.g. employing reactive ionic etching contained, in the case of a polycrystalline silicon material 22, sulphur hexafluoride as the etching agent.

Figure 7:
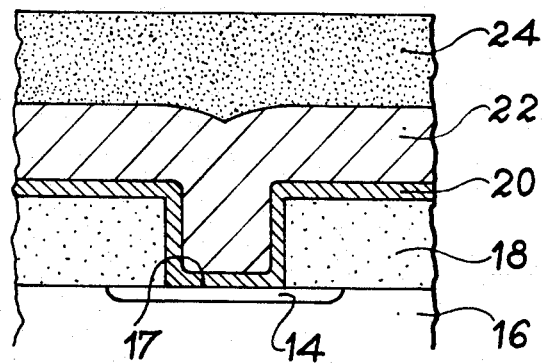
FIGS. 7 and 8 diagrammatically, a variant of the autopositioning process according to the invention.

According to the invention, it is also possible to use a "planarization" for carrying out the etching of the filling material 22, so as to completely eliminate those parts of the material 22 positioned above the parts 20a of the first conductive coating and located outside the electric contact hole 17. This procedure is illustrated in FIGS. 7 and 8.

It firstly consists of covering the filling material 22 with a resin layer 24 (FIG. 7) using a conventional spreading process. This resin layer 24, which can be formed from a resin currently used in photolithography, e.g. has a thickness of 1.5 to 2 $\mu$m. Following deposition, anisotropic etching is simultaneously carried out on resin layer 24 and filling material 22, at identical etching speeds for the resin and filling material. When filling material 22 of polycrystalline silicon, the simultaneous etching of the resin and the silicon can e.g. be carried out with a reactive ionic etching process using as the etching agent a mixture of sulphur hexafluoride and oxygen ($SF_6 + O_2$). As hereinbefore, this etching has a selectivity character, which makes it possible to stop etching as soon as the regions 20a of the first conductive coating 20 have been exposed and whilst leaving the electric contact holes 17 completely filled with material 22 (FIG. 8).

Figure 8:
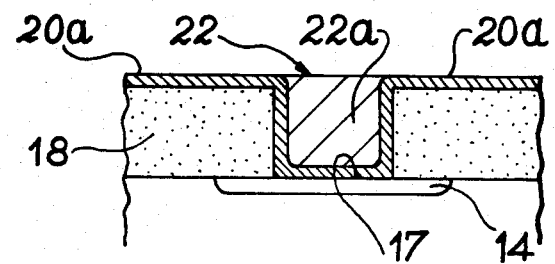

This "planarization" procedure makes it possible to obtain a region 22a of material 22 filling the contact hole and having a planar surface (FIG. 8).

Figure 9:
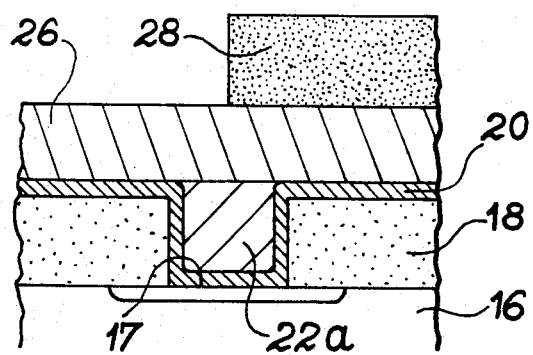

The following stage of the process consists, as shown in FIG. 9, of the deposition on the structure obtained (FIG. 6 or 8) of a second conductive coating 26 in which the interconnection line will be formed. This conductive coating 26, which is e.g. of aluminium has a thickness ranging between 5,000 and 10,000 Å (0.5 to 1 $\mu$m). It can be obtained by a deposition process using magnetron sputtering or by vacuum evaporation.

On the second conductive coating 26 is then formed a resin mask 28 for defining the dimensions of the interconnection line to be produced. This resin mask 28, which can be formed by conventional microphotolithography methods, represents the image of the interconnection line to be produced.

Figure 10:
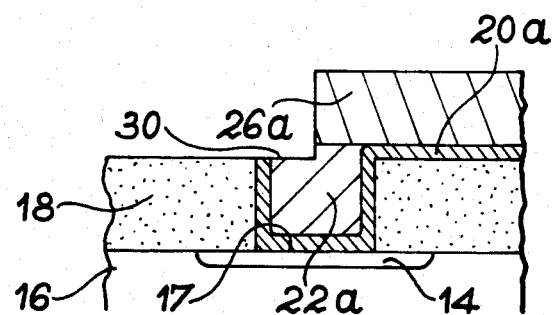

After producing mask 28, those parts of the second conductive coating 26 which are free of the mask are eliminated, in order to form the interconnection line 26a as shown in FIG. 10. This can be obtained by etching the conductive coating 26, e.g. using a dry anisotropic etching process with carbon tetrachloride, when the conductive coating 26 is made from aluminium.

This is followed by the elimination of those parts of the first conductive coating 20 which are free from mask 28. This caan be carried out during the same anisotropic etching stage as that of the second conductive coating 26, said etching making it possible to stop selectively above region 22a of filling material 22, which is more particularly polycrystalline silicon, which fills the electric contact hole, and also on the insulating layer 18, particularly of silicon oxide used for the formation of the electric contact hole 17. Thus, this etching of the first conductive coating 20 is carried out by the same reactive ionic etching process using carbon tetrachloride when the first conductive coating is formed from an alloy of titanium and tungsten, or of tungsten alone.

The final stage of the process consists of eliminating the resin mask 28, e.g. by chemical etching. FIG. 10 shows the final structure after etching the interconnection line and eliminating the resin.

In this process, the electric contact between the active zone 14 and the interconnection line 26a is obtained by means of the residual region 20a of the first conductive coating which is in contact with the interconnection line.

Even if the resin mask used for the definition of the interconnection line is misaligned with respect to the electric contact hole due to the region 22a of the filling material 22 filling said contact hole, the process according to the invention makes it possible to ensure a good electric contact over the entire surface of the contact hole.

Moreover, this process permits an autoalignment of the interconnection line on the electric contact hole, i.e. it prevents any useless overlap or projection from the contact hole of the interconnection line and consequently significantly increases the integration density of the integrated circuits compared with the various known processes.

The above description of the autopositioning process according to the invention is obviously not given in a limitative manner. In particular, it is possible to use other deposition and etching procedures for the different material layers used in the process according to the invention, as well as materials other than those described for forming these different layers.

What is claimed is:

1. A process for autopositioning an interconnecting line on an electric contact hole of an integrated circuit, consistng of the successive steps of:
    (a) forming an insulating layer on a whole substrate having a semiconductor active zone;
    (b) forming an opening in said insulating layer in front of said active zone, in order to obtain said electric contact hole;
    (c) depositing a first conductive coating on said insulating layer and on said active zone;
    (d) depositing on said first conductive coating a filling material used for filling the contact hole, the surface of said material being substantially planar;
    (e) carrying out an anisotropic etching of said filling material, so as to expose those parts of said first conductive coating located outside said contact hole, and while retaining only that filling material portion which fills the contact hole;
    (f) depositing on the structure obtained a second conductive coating, in which said interconnecting line will be formed;
    (g) forming on said second conductive coating a resin mask used for defining the dimensions of said interconnecting line;
    (h) eliminating those parts of said second and first conductive coating which are free from the mask, in order to form said inteconnecting line;
    (i) eliminating said mask.

2. A process according to claim 1, wherein the first conductive coating is a metallic film ensuring a diffusion barrier between the second conductive coating and the semiconducting junctions on which the electric contact is formed.

3. Process according to claim 2, wherein the first conductive coating is made from an alloy of titanium or tungsten, or of tungsten alone.

4. A process according to claim 1, wherein the filling material is of polycrystalline silicon.

5. A process according to claim 1, wherein the filling material is isotropically deposited.

6. A process according to claim 1, wherein the filling material is a thickness greater than half the width of the electric contact hole.

7. A process according to claim 1, wherein stage (e) is performed by depositing a resin layer on the filling material and by simultaneously etching the resin layer and the filling material at identical etching speeds for both the resin and filling material.

8. A process according to claim 1, wherein stage (h) is performed by means of dry anisotropic etching.

* * * * *